United States Patent [19]

Bélouet et al.

[11] Patent Number: 4,762,687

[45] Date of Patent: Aug. 9, 1988

[54] MEANS FOR FORMING A MELT OF A SEMICONDUCTOR MATERIAL IN ORDER TO MAKE A CRYSTALLINE ELEMENT GROW THEREIN

[75] Inventors: Christian Bélouet, Sceaux; Michel Mautref, Ozoir la Ferriere, both of France

[73] Assignees: Societe Nationale Elf Aquitaine, Courbevoie; Compagnie General d'Electricite, Paris, both of France

[21] Appl. No.: 945,710

[22] Filed: Dec. 23, 1986

[30] Foreign Application Priority Data

Dec. 23, 1985 [FR] France .................... 85 19041

[51] Int. Cl.⁴ .................. C30B 21/06; C30B 35/00
[52] U.S. Cl. .................... 422/253; 422/108; 422/245; 422/248; 118/405; 156/601; 156/624; 156/DIG. 64; 156/DIG. 68
[58] Field of Search ....... 156/601, 621, 624, DIG. 64, 156/DIG. 88; 118/405, 245; 422/253, 248, 108

[56] References Cited

U.S. PATENT DOCUMENTS

| 3,206,286 | 9/1965 | Bennett et al. | 156/601 |
| 4,036,595 | 7/1977 | Lorenzini et al. | 422/253 |
| 4,242,307 | 12/1980 | Fally | 156/DIG. 64 |
| 4,282,184 | 8/1981 | Fregl et al. | 156/601 |
| 4,447,289 | 5/1984 | Geissler et al. | 156/DIG. 64 |
| 4,577,588 | 3/1986 | Mautref et al. | 118/405 |
| 4,616,595 | 10/1956 | Belouet | 118/405 |

OTHER PUBLICATIONS

Belouet et al., Growth of Polysilicon Sheets on a Carbon Shaper by the Rad Process, Journal of Crystal Growth, 61, 1963, pp. 615-628.

Primary Examiner—John Doll
Assistant Examiner—Robert M. Kunemund
Attorney, Agent, or Firm—Sughrue, Mion, Zinn, Macpeak, and Seas

[57] ABSTRACT

The inventive means includes a supply vessel (10) having a bottom opening (14), feed means (15 to 17) for supplying the vessel (10) with solid silicon and means (11 to 13) for heating the vessel, said vessel being placed above the crucible (1) containing the melt (8) so that the molten silicon in the vessel (10) flows out through the bottom opening (14) into the crucible (1) when the level (h) of the molten silicon in the supply vessel reaches a maximum value (20) and the replenishing flow stops when the level (h) has fallen to a minimum value (22). An application involving the deposition of a layer of polycrystalline silicon onto a carbon tape is described.

3 Claims, 1 Drawing Sheet

U.S. Patent
Aug. 9, 1988
4,762,687
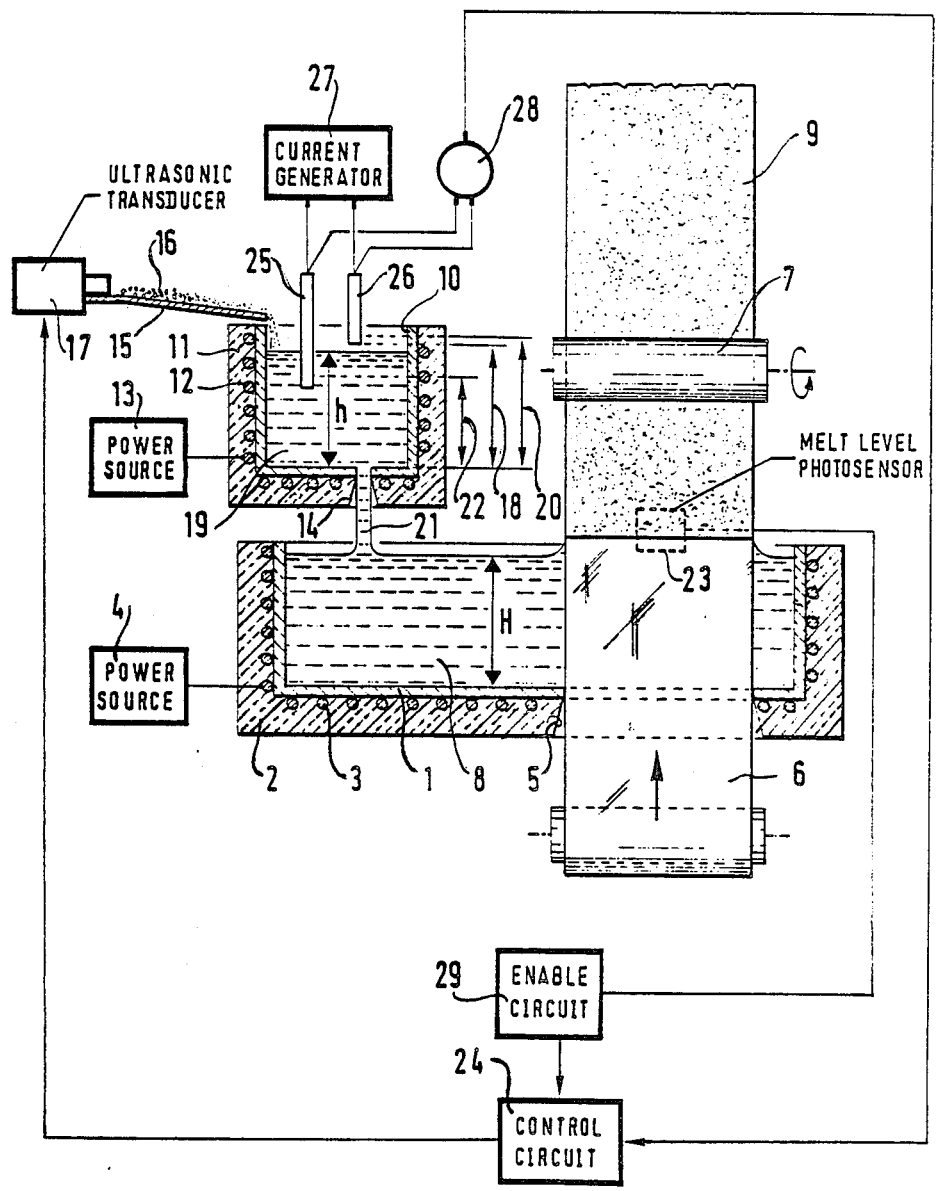

MEANS FOR FORMING A MELT OF A SEMICONDUCTOR MATERIAL IN ORDER TO MAKE A CRYSTALLINE ELEMENT GROW THEREIN

This invention concerns means for forming a melt of a semiconductor material in order to make a crystalline element grow therein.

The inventive means is of the type comprising the following parts:

a crucible, feed means for conveying semiconductor material to the crucible, means of heating the crucible, and means for bringing about growth of the crystalline element in the melt.

A prior art means of this type is described in the article by C. Belouet et al, entitled "Growth of polysicilon sheets on a carbon shaper by the RAD process," published in the Journal of Crystal Growth (61, 1983, pp. 615-628), by the North-Holland Publishing Company. In that device, the semiconductor material is silicon and the crystalline element grown in the melt is a layer of polycrystalline silicon deposited onto a carbon tape; the feed means for bringing semiconductor material into the crucible include an electromechanical dispenser operable to drop into the crucible, at regular intervals, small cubes of silicon having been preheated to 1000° C.

This device has certain disadvantages however. Indeed, when the silicon cubes arrive in the melt, the melt cools, immediately affecting the thickness of the layer deposited on the tape. Also, the time required to reduce the silicon cubes to a molten state in the melt is sometimes too long to compensate for the depletion of liquid-phase silicon in the melt due to crystal growth.

It is the object of this invention to obviate these disadvantages.

Accordingly, the invention provides a means of the above-described type for forming a melt of a semiconductor material in order to make a crystalline element grow therein, wherein the said feed means for conveying semiconductor material into the melt include a supply vessel having a bottom opening, said vessel being disposed above the crucible such that its opening is vertically aligned with the inside of the crucible, means for supplying the vessel with granules of the said semi-conductor material, and means of heating the vessel, operable to bring about fusion of the granules to form a melt of semiconductor material, the size of the cross-section of the opening in the vessel being selected so that the said molten matter remains inside the vessel as long as the level of said molten matter does not reach some maximum value, the molten matter flowing out through said opening into the crucible to form the said crucible melt as soon as the level of molten material reaches the said maximum value, the outflow of molten matter continuing as long as its level inside the vessel remains higher than a minimum value, less than said maximum value, and the means of heating the crucible being operable to maintain in a molten state the melt from which the crystalline element is grown.

The means according to the invention can further comprise the following features:

a first level sensor, operable to emit a first electrical signal when the level of the melt in the crucible in less than a predetermined value, a second level sensor, operable to emit a second electrical signal when the level of the melted semiconductor material in the vessel is higher than a predetermined threshold, the threshold being less than the said maximum value and greater than the said maximum value, a control circuit, connected to said second level sensor and to the vessel supply means, said control circuit being operable to control the actuation of the said supply means when the second signal is not emitted and being inhibited when it receives said second signal, and an enabling circuit, connected to the first sensor and to the control circuit, which enabling circuit is operable to emit a third electrical signal when the first signal is emitted, which third signal can enable the control circuit when the latter is inhibited by the second signal, said third signal having no effect on the control circuit when it is not inhibited by the second signal.

In accordance with one embodiment of the invention, the semiconductor material is silicon and the said crystalline element is a layer of silicon deposited onto a carbon substrate.

Various embodiments of the invention will be described hereinafter, by way of example only, with reference to the sole accompanying figure representing one particular, an apparatus for forming a melt of a semiconductor material in order to make a crystalline element grow therein.

The FIGURE shows a quartz crucible 1 the outside surface whereof is surrounded by an electric oven 2 equipped with a heating resistance 3 connected to an electrical power source 4. The bottom of the tank made up of the crucible 1 and the oven 2 comprises a slit 5 through which vertically passes a carbon tape 6 pulled upwardly by mechanical means that may include, for example, rollers 7. A melt of molten silicon 8 is contained in the crucible 1, the dimensions of the slit being determined such as to preclude any leakage of molten silicon. The tape 6 goes through the melt 8 in such a manner that its two plane faces are coated, on leaving the melt, with a layer 9 of solid, polycrystalline silicon.

Above the crucible 1 a vessel 10, also made of quartz, is disposed, whose outside surface is surrounded by an electric oven 11 equipped with a heating resistance 12 connected to an electrical power source 13. The bottom of the tank made up of the vessel 10 and the oven 11 comprises an opening 14. A chute 15 is disposed over the top rim of the vessel 10 and slants down toward the inside of the vessel 10. Silicon in granular form 16, as shown in the drawing, is placed in the chute, and a mechanical effector part of an electromechanical transducer 17 is mounted on top of the chute.

The operation of the inventive means just described and illustrated by items 1 through 17 of the figure is as follows.

The electromechanical transducer is started so that it delivers ultrasonic vibrations to slidably entrain the granules 16 down the ramp of the chute 15 and into the inside of the vessel 10. The heat produced by the oven 10 melts the granules 16 to form a liquid volume 19 of molten silicon held within the vessel 10. The cross-section of the opening 14 is made such that the liquid volume 19 remains in the vessel 10 and does not flow out through the opening 14 as long as the level or height h of molten silicon in the vessel 10 is less than a first, maximum value 20. As soon as the level or height of molten silicon in vessel 10 reaches the maximum value 20, the ultrasonic generator 17 is turned off. The molten silicon contained in the vessel 10 then flows out through the opening 14 into the crucible 1 in the form of a cylindrical column of liquid 21, until the height of molten silicon in vessel 10 has been reduced to a second, minimum value 22 less than the maximum value 20. Preferably, the axis of the column 21 is located substantially in the plane of the tape 6.

The transducer 17 is restarted, thus causing several successive flows of molten silicon, until the level of the melt 8 reaches a predetermined value Ho, the molten silicon in the bath being kept at its melting temperature by the heat input of the oven 2.

The deposition of the layer 9 of polycrystalline silicon onto the tape 6 causes a corresponding depletion of the molten silicon in the melt 8, causing its level to fall.

To makeup for this depletion, the transducer 17 is turned back on when the level of the melt 8 falls below the predetermined value Ho. As soon as the level of molten material in the vessel 10 reaches the first, maximum value 20, a volume of molten silicon equal to the product of the cross-section of the vessel 10 times the difference between levels 20 and 22 flows out of the vessel into the crucible 1.

As an indication of actual size realizations of the invention, the level values 20 and 22 for a cylindrical vessel with an inside diameter of 28 mm, having a cylindrical bottom opening 3 mm in diameter, would be 27.5 mm and 21 mm respectively. Each outflow of molten silicon would thus have a volume of approximately 4 cubic centimeters. Assuming that the pulling operation depletes the molten silicon at the rate of 0.67 cm$^3$/mn, a single outflow of molten silicon is enough to make up the depletion of silicon occurring in the device over 5 mn 30 s.

The means described hereinabove, by feeding molten silicon into the melt 8, avoids any thermal unbalancing as occurs in the prior art device when solid silicon arrives in the melt. Moreover, the inventive means has the advantage of operating without any physical connection or any moving parts (such as a piston) between the supply vessel and the crucible. It is also easy to make and the internal volume of the vessel can be made very small to reduce the thermal energy requirement.

The means just described is preferably completed with a system of automatic control of the level of the melt 8.

As shown in the figure, such a system can comprise a photoelectric sensor 23 of the level H of the melt 8 in crucible 1. The sensor can be of the type described in the French patent application published under No. 2,551,233. The electrical output of the sensor 23 is connected to the input of an enabling circuit 29.

A level sensor for the molten silicon in vessel 10 comprises a graphite electrode 25 placed vertically inside the vessel such that its bottom end is slightly lower than level 22. Another graphite electrode 26 is placed vertically inside vessel 10 such that its bottom end is at a level 18 slightly below level 20. Electrodes 25 and 26 are respectively connected to the two terminals of an electric current generator 27. They are also connected to the input of a circuit 28 the output whereof is connected to the transducer 17 via a control circuit 24. The output of circuit 29 is connected to ciruit 24.

When the top electrode 26 is not immersed in the supply melt 19 contained in vessel 10, the generator 17 delivers its no-load voltae to the input of circuit 28. The latter then does not supply any electrical signal. When the supply melt 19 reaches level value 18, the bottom end of electrode 26 is immersed and electrical generator 27 supplies a current which flows into the molten silicon through the electrodes 25 and 26. Generator 27 has a low impedance, making its voltage under load substantially less than its voltage without load. When the circuit 28 receives at its input the load voltage of generator 27, it delivers an electrical signal.

In addition, the crucible 1 melt 8 level sensor 23 supplies an electrical signal when the level H of the melt 8 is less than height Ho, and does not supply a signal when the level H is greater than or equal to Ho.

The operation of the automatic melt 8 level control system is as follows.

The control circuit 24 enables the transducer 17 as long as the level h in the vessel 10 remains lower than level value 18. The supply melt 19 is supplied with solid silicon so that its level h rises. When this level reaches the threshold value 18, circuit 24 receives at its input the electrical signal supplied by circuit 28, which inhibits circuit 24. Two alternative cases may occur at this point.

If the level H melt 8 in crucible 1 is less than the value Ho, the sensor 23 delivers an electrical signal which is received by the enabling circuit 29. The latter then supplies an electrical signal to control circuit 24, enabling said control circuit. The transducer 17 functions and continues to supply solid silicon to the supply melt 19, raising the level h up to the value 20. The supply melt 19 then flows out through the opening 14 into the crucible melt 8. As soon as the level h of the supply melt 19 falls below the level value 18, the control circuit 24, no longer receiving the electrical signal from circuit 28, is no longer inhibited by this signal and resumes normal driving of the transducer 17. Obviously, the enabling signal still being received by circuit 24 has no effect on this circuit. Vessel 10 loses more molten matter through opening 14 than it gains from the supply of solid silicon. When the level of the supply melt 19 has fallen to level value 22, the molten matter ceases to flow out through opening 14 and the supply melt's level again rises.

If on the other hand the level H of the crucible melt 8 is the same or higher than Ho, the sensor 23 does not output an electrical signal. Control circuit 24 remains inhibited and vessel 10 is no longer supplied with solid silicon. Vessel 10 therefore remains filled to level 18 until the level H of the melt 8 in the crucible 1 falls below level Ho.

Thus, the level of the melt 8 is kept at level value Ho, with an accuracy that depends on the volume of liquid silicon held in vessel 10 between levels 20 and 22.

It should be understood that the means according to the present invention can be applied to forming any type of melt of molten semiconductor material, including for the purpose, for example, of pulling single crystals, without departing from the scope or spirit of the invention. Moreover, the level of molten silicon in the vessel may be detected by other means than those described, for instance by photoelectric sensing of a laser beam reflected by the equilibrium surface of the molten silicon.

What is claimed is:

1. In an apparatus for forming a melt of a semiconductor material in order to make a crystalline element grow therein, comprising:
    a crucible, feed means for conveying semiconductor material into the crucible, means for heating the crucible, and means for bringing about the growth of the crystalline element in the melt, the improvement wherein said feed means for conveying semiconductor material into the crucible comprises:

a vessel having an opening in the bottom thereof, said vessel being disposed above the crucible such that said opening is vertically aligned with the inside of the crucible, means for the controlled supplying of said vessel with granules of the said semiconductor material, means for heating said vessel to bring about fusion of the granules to form a melt of semiconductor material therein, the size of the cross-section of the opening in the bottom of the vessel being selected so that said semiconductor material melt remains inside the vessel as long as the level of said melt does not reach a first, high value and that the melt flows freely out through the opening in the bottom of the vessel into the crucible to form said crucible melt as soon as the level of melt reaches said first value, and that the outflow of melt continues as long as the level of the melt inside the supply vessel remains higher than a second value, less than said first value, and control means responsive to the level in said crucible for controlling said granule supply means of said vessel.

2. The apparatus according to claim 1, wherein said control means comprises:

a first level sensor, operable to emit a first electrical signal when the level of the melt in the crucible is less than a value for desired growth of the crystalline element in the crucible melt, a second level sensor, operable to emit a second electrical signal when the level of the melted semiconductor material in the vessel is at a third value less than said first value and greater than said second value, a control circuit, connected to said second level sensor and to the vessel granule supply means, said control circuit being operable to control the actuation of said supply means when the second signal is not emitted and being inhibited when it receives said second signal, and an enabling circuit, connected to the first sensor and to the control circuit, which enabling circuit is operable to emit a third electrical signal when the first signal is emitted, which third signal can enable the control circuit when the latter is inhibited by the second signal, said third signal having no effect on the control circuit when it is not inhibited by the second signal.

3. The apparatus according to claim 1 or 2, wherein said semiconductor material is silicon and said crystalline element is a layer of silicon deposited on a carbon substrate.

* * * * *